(12) United States Patent
Choi et al.

(10) Patent No.: US 10,084,128 B2
(45) Date of Patent: Sep. 25, 2018

(54) METHOD FOR INCREASING DRIVING CURRENT OF JUNCTIONLESS TRANSISTOR

(71) Applicants: Korea Advanced Institute of Science And Technology, Daejeon (KR); CENTER FOR INTEGRATED SMART SENSORS FOUNDATION, Daejeon (KR)

(72) Inventors: Yang-Kyu Choi, Daejeon (KR); Jun-Young Park, Daejeon (KR); Chang-Hoon Jeon, Daejeon (KR)

(73) Assignees: Korea Advanced Institute of Science and Technology, Daejeon (KR); Center for Integrated Smart Sensors Foundation, Daejeon (KR)

( * ) Notice: Subject to any disclaimer, the term of this patent is extended or adjusted under 35 U.S.C. 154(b) by 0 days.

(21) Appl. No.: 15/426,719

(22) Filed: Feb. 7, 2017

(65) Prior Publication Data
US 2018/0102477 A1   Apr. 12, 2018

(30) Foreign Application Priority Data
Oct. 7, 2016 (KR) .......................... 10-2016-0129673

(51) Int. Cl.
| | | |
|---|---|---|
| H01L 29/06 | (2006.01) |
| H03H 9/24 | (2006.01) |
| H01L 29/775 | (2006.01) |
| H01L 21/762 | (2006.01) |
| H01L 27/088 | (2006.01) |
| G11C 16/04 | (2006.01) |
| H01L 27/11 | (2006.01) |
| H01L 21/74 | (2006.01) |
| H01L 29/78 | (2006.01) |
| H01L 29/792 | (2006.01) |

(Continued)

(52) U.S. Cl.
CPC ...... *H01L 45/1206* (2013.01); *H01L 29/0673* (2013.01); *H01L 29/42392* (2013.01); *H01L 45/1226* (2013.01); *H03K 17/687* (2013.01)

(58) Field of Classification Search
CPC ............. H01L 45/1206; H01L 29/0673; H01L 29/42392; H01L 45/1226; H03K 17/687
USPC ..... 327/108–112, 379, 389, 391; 326/22–27, 326/81–87
See application file for complete search history.

(56) References Cited

U.S. PATENT DOCUMENTS 9,660,107 B1 *  5/2017  Colinge ................ H01L 29/792
9,825,043 B2 * 11/2017  Colinge .............. H01L 27/1104

(Continued)

*Primary Examiner* — Brandon S Cole
(74) *Attorney, Agent, or Firm* — Foley & Lardner LLP (57) ABSTRACT

Provided is a method for increasing a driving current of a junctionless transistor that includes: a substrate; a source region and a drain region which are formed on the substrate and are doped with the same type of dopant; a nanowire channel region which connects the source region and the drain source and is doped with the same type dopant as that of the source region and the drain region; a gate insulation layer which is formed to surround the nanowire channel region; and a gate electrode which is formed on the gate insulation layer and is formed to surround the nanowire channel region. An amount of current flowing through the nanowire channel region is increased by joule heat generated by applying a voltage to the source region and the drain region.

7 Claims, 7 Drawing Sheets

(51) Int. Cl.
*H01L 45/00* (2006.01)
*H01L 29/423* (2006.01)
*H03K 17/687* (2006.01)

(56) References Cited

U.S. PATENT DOCUMENTS

| | | | | |
|---|---|---|---|---|
| 2010/0276662 A1* | 11/2010 | Colinge | ................ | B82Y 10/00 257/9 |
| 2011/0280076 A1* | 11/2011 | Samachisa | ............ | B82Y 10/00 365/185.17 |
| 2012/0220102 A1* | 8/2012 | Or-Bach | ........... | H01L 21/76254 438/458 |
| 2012/0305893 A1* | 12/2012 | Colinge | ................ | B82Y 10/00 257/29 |
| 2013/0203248 A1* | 8/2013 | Ernst | ................... | H01L 21/8221 438/530 |
| 2014/0252451 A1* | 9/2014 | Han | ................... | G11C 16/0416 257/324 |
| 2015/0102466 A1* | 4/2015 | Colinge | ............. | H01L 29/0673 257/618 |
| 2015/0137068 A1* | 5/2015 | Bartsch | ............. | H03H 9/02259 257/9 |
| 2017/0236901 A1* | 8/2017 | Choi | ................... | H01L 29/0673 257/347 |

* cited by examiner

FIG. 6B

METHOD FOR INCREASING DRIVING CURRENT OF JUNCTIONLESS TRANSISTOR

BACKGROUND

Field

The present disclosure relates to a method for increasing a driving current of a junctionless transistor, and more particularly to a method for enhancing the device performance of a junctionless transistor by using local joule heat generated by an electrical signal (bias voltage) applied to a source region and a drain region.

Description of the Related Art

Recently, active research is being devoted to a junctionless transistor of which the dopants doped in a source region, a channel region, and a drain region have the same type as each other because the junctionless transistor has a relatively simple manufacturing process thereof and has an excellent property of inhibiting a short channel effect. However, a doping concentration of the channel region should be reduced in order to inhibit the short channel effect. This causes the increase of a parasitic resistance, so that the performance of the transistor may be degraded. For the purpose of solving such a problem, a method is proposed, which performs an additional doping process in the source region and the drain region, thereby reducing the parasitic resistance.

SUMMARY

One embodiment is a method for increasing a driving current of a junctionless transistor that includes: a substrate; a source region and a drain region which are formed on the substrate and are doped with the same type of dopant; a nanowire channel region which connects the source region and the drain source and is doped with the same type dopant as that of the source region and the drain region; a gate insulation layer which is formed to surround the nanowire channel region; and a gate electrode which is formed on the gate insulation layer and is formed to surround the nanowire channel region. An amount of current flowing through the nanowire channel region is increased by joule heat generated by applying a voltage to the source region and the drain region.

A concentration of the dopant doped in the source region and the drain region may be higher than that of the dopant doped in the nanowire channel region.

A plurality of the nanowire channel regions may be formed. The plurality of the nanowire channel regions is stacked in a direction vertical to the ground, so that a vertically stacked transistor may be formed.

The transistor may include at least one of a transistor formed by using group III-V elements, a transistor comprising germanium elements, a transistor formed by using two dimensional materials, a three dimensional transistor, a transistor comprising a High-k dielectric material and a metal gate electrode, a transistor comprising a polymer organic material, and a transistor formed by using a silicon-on-insulator wafer.

The three dimensional transistor may include at least one of a fin transistor, a gate-all-around transistor, a double-gate transistor, a tri-gate transistor, or an omega-gate transistor.

In the transistor comprising the High-k dielectric material and the metal gate electrode, a dielectric constant of the dielectric material may be greater than 4.

The transistor formed by using a silicon-on-insulator wafer may include at least one of strained silicon-on-insulator, germanium-on-insulator, strained germanium-on-insulator, or silicon germanium-on-insulator.

The gate electrode may include at least one of polycrystalline silicon, high concentration N type doped polycrystalline silicon, high concentration P type doped polycrystalline silicon, Au, TaN, Al, Mo, Mg, Cr, Pd, Pt, and Ti.

The gate electrode may include a metal silicide material.

The metal silicide material may include at least one of NiSi, $MoSi_2$, $TaSi_2$, $TiSi_2$, and $WSi_2$.

Other details of the present invention are included in the detailed description and drawings.

DETAILED DESCRIPTION

The features, advantages and method for accomplishment of the present invention will be more apparent from referring to the following detailed embodiments described as well as the accompanying drawings. However, the present invention is not limited to the embodiment to be disclosed below and is implemented in different and various forms. The embodiments bring about the complete disclosure of the present invention and are only provided to make those skilled in the art fully understand the scope of the present invention. The present invention is just defined by the scope of the appended claims.

While terms such as the first and the second, etc., can be used to describe various components, the components are not limited by the terms mentioned above. The terms are used only for distinguishing between one component and other components. Therefore, the first component to be described below may be the second component within the spirit of the present invention.

Terms used in the present specification are provided for description of only specific embodiments of the present invention, and not intended to be limiting. In the present specification, an expression of a singular form includes the expression of plural form thereof if not specifically stated. The terms "comprises" and/or "comprising" used in the specification is intended to specify characteristics, numbers, steps, operations, components, parts or any combination thereof which are mentioned in the specification, and intended not to exclude the existence or addition of at least one another characteristics, numbers, steps, operations, components, parts or any combination thereof.

Unless differently defined, all terms used herein including technical and scientific terms have the same meaning as commonly understood by one of ordinary skill in the art to which the present invention belongs. Also, commonly used terms defined in the dictionary should not be ideally or excessively construed as long as the terms are not clearly and specifically defined in the present application.

Hereinafter, preferred embodiments in accordance with the present invention will be described with reference to the accompanying drawings. The preferred embodiments are provided so that those skilled in the art can sufficiently understand the present invention, but can be modified in various forms and the scope of the present invention is not limited to the preferred embodiments.

In a junctionless transistor having a structure in which a gate electrode surrounds a nanowire channel region, when a voltage is applied to a source region and a drain region, high temperature joule heat is generated and can be applied in various applications.

In an existing PN junction electric field effect transistor, the high temperature joule heat is generated by applying a voltage to a gate word line, thereby restoring a damaged gate insulation layer. The joule heat is generated on the gate word line of a flash memory, thereby obtaining a quick clearing function.

The junctionless transistor has the same polarity from the source region to the drain region through the channel region. Therefore, unlike the existing PN junction electric field effect transistor, the joule heat can be generated by applying a voltage between the source region and the drain region.

Through use of local joule heat generated by an electrical signal applied to the source region and the drain region, the device performance of the junctionless transistor can be significantly improved. According to the present invention, the problems of the junctionless transistor can be solved. Also, the present invention can be widely applied to various fields of application in terms of the activation and redistribution of dopant using the joule heat generation.

Figure 1:
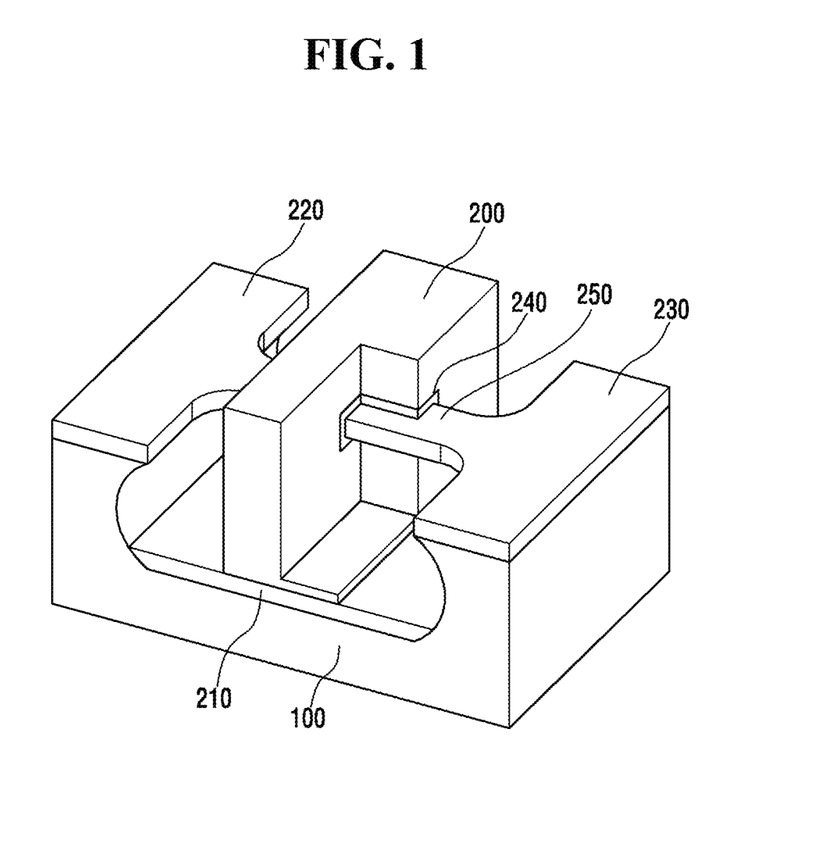
FIG. 1 is a perspective view schematically showing the inside of a junctionless transistor to which an embodiment of the present invention is applied.
Figure 2:
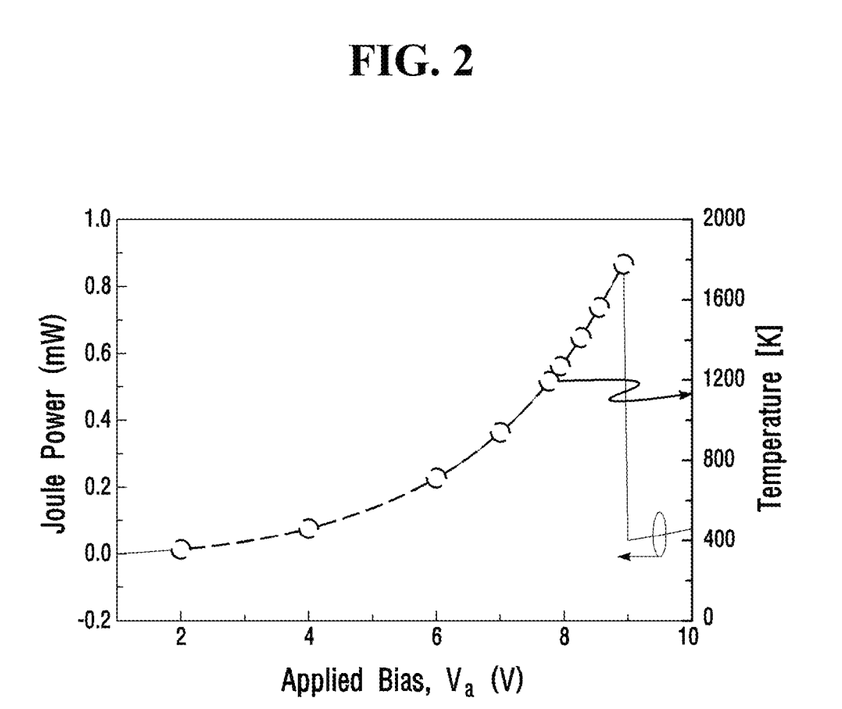
FIG. 2 is a graph showing simulation data for joule heat generated by applying a voltage to a source region and a drain region.

FIG. 1 is a perspective view schematically showing the inside of the junctionless transistor to which an embodiment of the present invention is applied. FIG. 2 is a graph showing simulation data for the joule heat generated by applying a voltage to the source region and the drain region.

Referring to FIG. 1, the junctionless transistor includes a substrate 100, a device separation film 210, a gate electrode 200, a gate insulation layer 240, a source region 220, a drain region 230, and a channel region 250.

The device separation film 210 may include, for example, a shallow trenched isolation (STI) structure. The channel region 250 may be formed in the form of a nanowire channel.

Here, the source region 220, the drain region 230, and the channel region 250 are all doped with the same type of dopant, so that they may have the same polarity. Also, for example, the concentration of the dopant doped in the source region 220 and the drain region 230 may be higher than that of the dopant doped in the channel region 250. That is, the source region 220, the channel region 250, and the drain region 230 may be doped with n+/n/n+ type of dopant respectively, or may be doped with p+/p/p+ type of dopant respectively.

The gate insulation layer 240 may be formed to surround the channel region 250. On the gate insulation layer 240, the gate electrode 200 may be formed to surround the channel region 250.

According to the embodiment of the present invention, the junctionless transistor in which the gate electrode 200 surrounds the channel region 250 is used. However, there is no limitation to this. The junctionless transistor can be embodied with variety within a range that a skilled person in the art to which the present invention pertains can understand.

According to the embodiment of the present invention, the channel region 250 of the junctionless transistor may be locally heated by the joule heat generated by applying a voltage to two electrodes of the source region 220 and the drain region 230, and the amount of the current flowing through the channel region 250 may be increased.

According to the embodiment of the present invention, unlike what is shown in FIG. 1, the channel region 250 may be formed in the form of a plurality of nanowire channels. That is, the plurality of nanowire channels are stacked in a direction vertical to the ground, so that a vertically stacked transistor can be formed.

Referring to FIG. 2, FIG. 2 shows an optimum value of a voltage which is applied between the source region 2200 and the drain region 230. In the embodiment of the present invention, for the purpose of the optimizing the performance improvement of the junctionless transistor, a bias voltage of approximately 9 V may be applied between the source region 220 and the drain region 230.

Referring back to FIG. 1, the gate insulation layer 240 may include at least one of a silicon dioxide film, a nitride film, an aluminum oxide film, a hafnium oxide film, a hafnium oxynitride film, a zinc oxide film, a lanthanum oxide film, and a hafnium silicon oxide film. At least one of fluorine, boron, deuterium, hydrogen, and nitrogen may be chemically added to the gate insulation layer 240.

The gate electrode 200 may include at least one of polycrystalline silicon, high concentration N type doped polycrystalline silicon, high concentration P type doped polycrystalline silicon, Au, TaN, Al, Mo, Mg, Cr, Pd, Pt, and Ti.

When the gate electrode 200 is made of a metallic material, leakage current of the gate insulation layer 240 can be prevented. As the transistor becomes smaller, there occur problems caused by the increase of the leakage current of the gate insulation layer as well as by short channel effect. Here, through use of a metal gate and a gate insulation layer including a high-k material, such a leakage current problem can be overcome. In view of the trend that the transistor becomes smaller and has a line width of 10 s nm, the metal gate can be applied to the embodiment of the present invention.

Also, the gate electrode 200 may include a metal silicide material. The metal silicide material may include at least one of $NiSi$, $MoSi_2$, $TaSi_2$, $TiSi_2$, and $WSi_2$.

Unlike what is shown in FIG. 1, the junctionless transistor may be a transistor formed by using group elements, a transistor including germanium elements, a transistor formed by using two dimensional materials, a three dimensional transistor, a transistor including a High-k dielectric material and a metal gate electrode, a transistor including a polymer organic material, and a transistor formed by using a silicon-on-insulator wafer.

The three dimensional transistor may be a fin transistor, a gate-all-around transistor, a double-gate transistor, a tri-gate transistor, or an omega-gate transistor.

In the transistor including a High-k dielectric material and the metal gate electrode, the dielectric constant of the dielectric material may be greater than 4. The High-k dielectric material may be, for example, $HfO_2$.

The transistor formed by using a silicon-on-insulator wafer may include strained silicon-on-insulator, germanium-on-insulator, strained germanium-on-insulator, or silicon germanium-on-insulator.

The silicon-on-insulator wafer adds an insulator such as $SiO_2$, $GeO_2$, etc., to the inside of the wafer, thereby effectively controlling the short channel effect resulting from the fact that the transistor becomes smaller. In view of the trend that the transistor becomes smaller and has a line width of 10 s nm, the silicon-on-insulator wafer can be applied to the embodiment of the present invention in order to control the effective control of the short channel effect.

Figure 3:
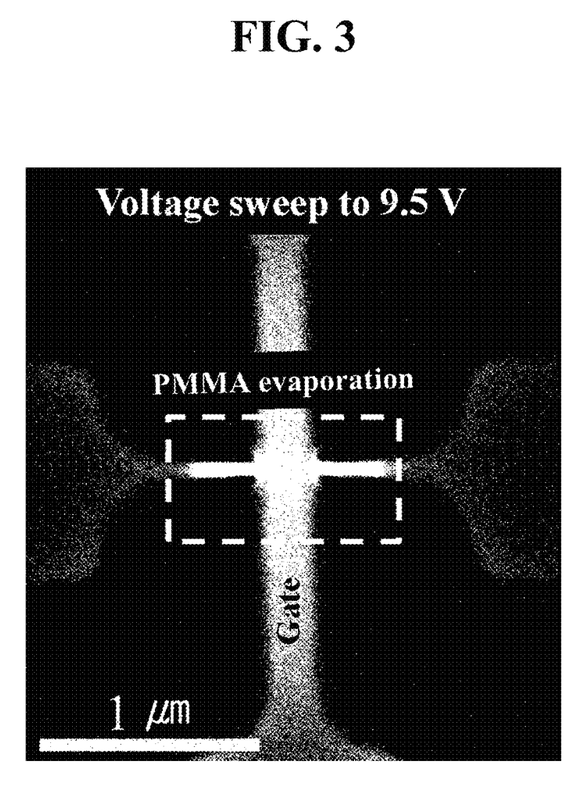
FIG. 3 is a transmission electron microscope (TEM) image showing that polymethylmethacrylate (PMMA) is deposited on an actually manufactured junctionless transistor and then the PMMA evaporated by the joule heat is measured.

FIG. 3 is a transmission electron microscope (TEM) image showing that polymethylmethacrylate (PMMA) is deposited on an actually manufactured junctionless transistor and then the PMMA evaporated by the joule heat is measured.

Referring to FIG. 3, FIG. 3 shows that the channel region 250 of the junctionless transistor is locally heated by the joule heat generated by applying a voltage to two electrodes of the source region 220 and the drain region 230, so that the deposited PMMA has been evaporated. It is possible to indirectly verify with reference to FIG. 3 that the channel region 250 has been locally heated.

Figure 4:
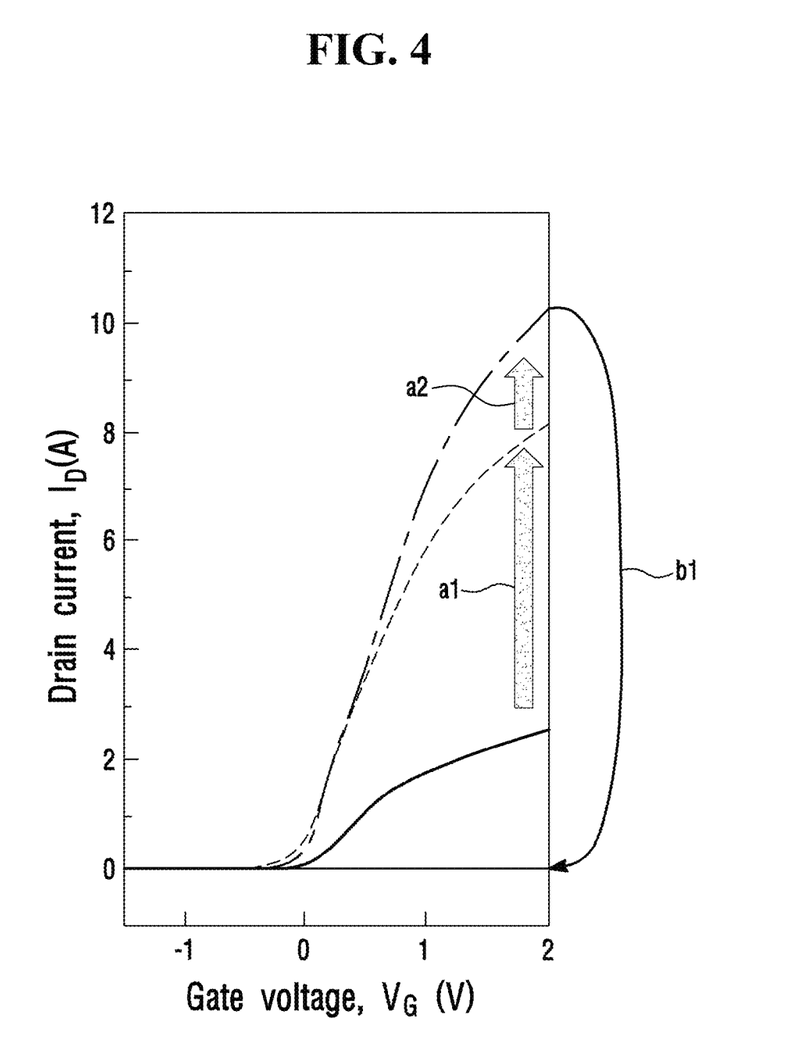
FIG. 4 is a graph showing experimental data verifying that a driving current is increased by the joule heat generated by applying a voltage to the source region and the drain region of the junctionless transistor.

FIG. 4 is a graph showing experimental data verifying that a driving current is increased by the joule heat generated by applying a voltage to the source region and the drain region of the junctionless transistor.

Referring to FIG. 4, the current amount of the junctionless transistor is increased by approximately more than four times by the joule heat generated by applying a voltage to the source region and the drain region. However, if a voltage higher than that is applied, the channel region may be broken by high temperature heat.

Referring to FIG. 4, in an initial state, when a voltage of ±4.5 V is applied to the source region and the drain region for 1 ms, the current amount is increased (as much as a1). Continuously, when a voltage of ±4.7 V is applied to the source region and the drain region for 1 ms, the current amount is increased (as much as a2).

The experiment of FIG. 4 is performed under the condition that the gate length (Lgate) is 150 nm, the width (Wnw) is 18 nm, the height (Hnw) is 18 nm, and the drain voltage (Vd) is 1 V.

Figure 5:
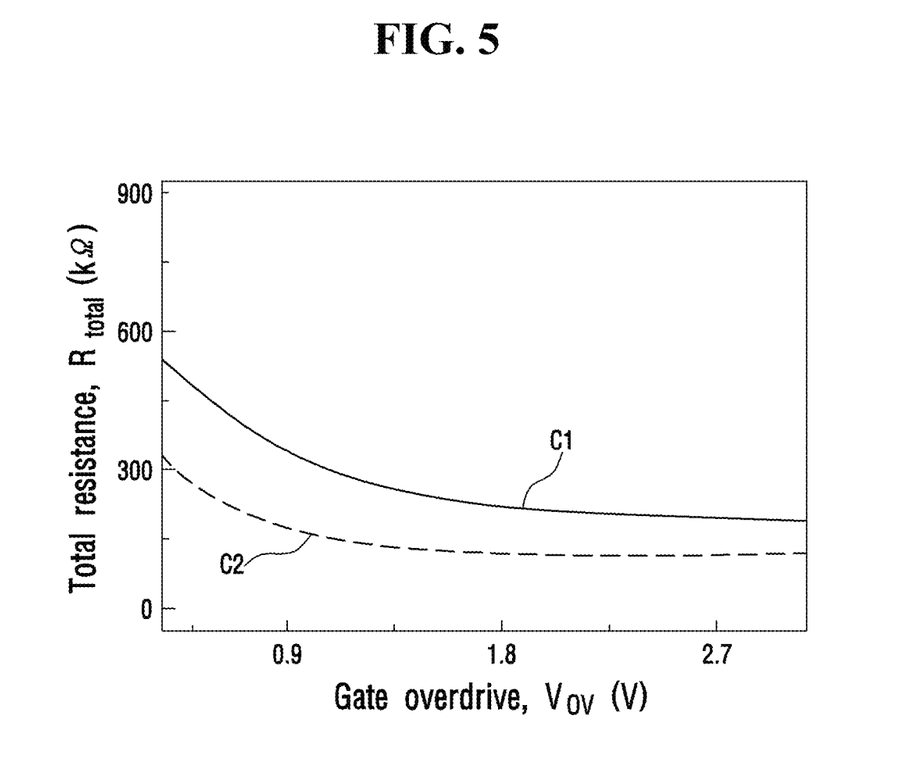
FIG. 5 is a graph showing experimental data verifying that the driving current is, as shown in FIG. 4, increased due to the reduction of a parasitic resistance.
Figure 6A:
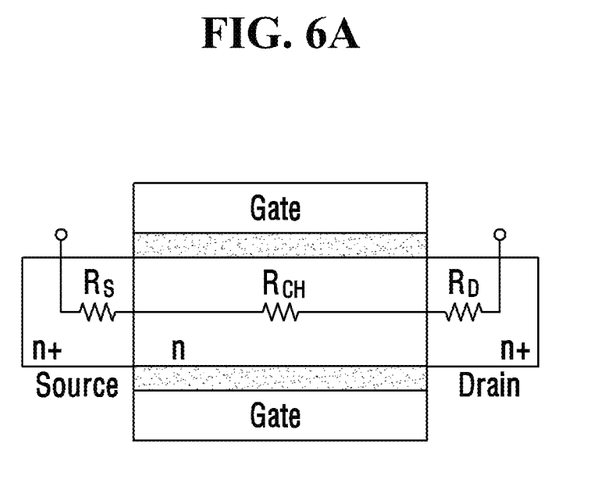
FIG. 6A is a circuit diagram showing the parasitic resistance of the transistor before joule heat is generated.
Figure 6B:
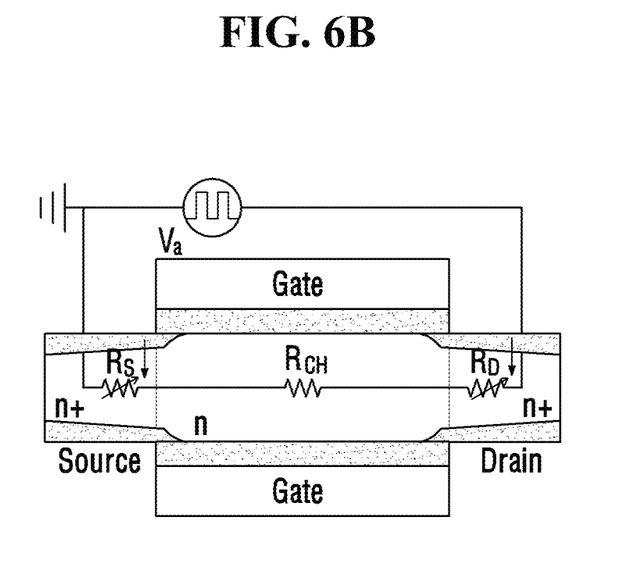
FIG. 6B is a circuit diagram showing the parasitic resistance of the transistor after the joule heat is generated.

FIG. 5 is a graph showing experimental data verifying that the driving current is, as shown in FIG. 4, increased due to the reduction of a parasitic resistance. FIG. 6A is a circuit diagram showing the parasitic resistance of the transistor before joule heat is generated. FIG. 6B is a circuit diagram showing the parasitic resistance of the transistor after the joule heat is generated.

Referring to FIG. 5, "c1" represents a value of the total parasitic resistance measured according to an overdrive voltage (Vov, VG-Vth) before the joule heat is generated. "c2" represents a value of the total parasitic resistance measured according to the Vov after the joule heat is generated. In the case of "c1", the parasitic resistance values of the source region and the drain region are 90 kΩ. In the case of "c2", the parasitic resistance values of the source region and the drain region are 65 kΩ.

Referring to FIGS. 6A and 6B, FIGS. 6A and 6B show the parasitic resistances before and after the joule heat is generated. It can be seen that the parasitic resistance values Rs and Rd of the source region and the drain region are reduced after the joule heat is generated.

According to the embodiment of the present invention, it is possible to reduce the parasitic resistance through the activation and redistribution of dopant doped in the source region and the drain region by using the joule heat generation. As a result, the driving current of the junctionless transistor can be increased.

According to the embodiment of the present invention, the source region, the drain region, and the channel region of the junctionless transistor have the same polarity. Therefore, the local joule heat can be generated by applying the electrical signal. Here, the source region and the drain region may have a high temperature because a gate structure functions as a heat absorber which absorbs the generated joule heat.

According to the embodiment of the present invention, the joule heat is generated for a very short time because the joule heat is generated by momentarily applying the electrical signal. The high temperature joule heat generated in this way further activates and redistributes the dopants of the source region and the drain region, so that parasitic resistance components are significantly reduced and the driving current of the transistor can be greatly increased. Here, other main characteristics of the transistor such as a threshold voltage (Vth), drain induced barrier lowering (DIBL) characteristic, subthreshold swing (SS) characteristic, etc., are not changed.

According to the embodiment of the present invention, the high temperature joule heat is locally generated for a short time in a component in which an additional doping process has been applied to the source region and the drain region, and the parasitic resistance is sufficiently reduced, so that the current characteristics of the transistor can be increased by approximately more than four times. Particularly, the joule heat generation can be effectively controlled by applying a voltage.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention.

What is claimed is:

1. A method for increasing a driving current of a junctionless transistor which comprises:
   a substrate;
   a source region and a drain region which are formed on the substrate and are doped with the same type of dopant;
   a nanowire channel region which connects the source region and the drain source and is doped with the same type dopant as that of the source region and the drain region;
   a gate insulation layer which is formed to surround the nanowire channel region; and
   a gate electrode which is formed on the gate insulation layer and is formed to surround the nanowire channel region,
   wherein a concentration of the dopant doped in the source region and the drain region is higher than that of the dopant doped in the nanowire channel region, the method comprising:

increasing an amount of current flowing through the nanowire channel region by joule heat generated by applying a voltage to the source region and the drain region.

2. The method of claim 1, wherein a plurality of the nanowire channel regions are formed and wherein the plurality of the nanowire channel regions are stacked in a direction vertical to the ground, so that a vertically stacked transistor is formed.

3. The method of claim 1, wherein the junctionless transistor comprises at least one of a transistor formed by using group III-V elements, a transistor comprising germanium elements, a transistor formed by using two dimensional materials, a three dimensional transistor, a transistor comprising a High-k dielectric material and a metal gate electrode, a transistor comprising a polymer organic material, and a transistor formed by using a silicon-on-insulator wafer.

4. The method of claim 3,
wherein the junctionless transistor is the three dimensional transistor, and
wherein the three dimensional transistor comprises at least one of a fin transistor, a gate-all-around transistor, a double-gate transistor, a tri-gate transistor, or an omega-gate transistor.

5. The method of claim 3,
wherein the junctionless transistor is the transistor comprising the High-k dielectric material and the metal gate electrode, and
wherein, in the transistor comprising the High-k dielectric material and the metal gate electrode, a dielectric constant of the dielectric material is greater than 4.

6. The method of claim 3,
wherein the junctionless transistor is the transistor formed by using a silicon-on-insulator wafer, and
wherein the transistor formed by using a silicon-on-insulator wafer comprises at least one of strained silicon-on-insulator, germanium-on-insulator, strained germanium-on-insulator, or silicon germanium-on-insulator.

7. The method of claim 1, wherein the gate electrode comprises at least one of polycrystalline silicon, high concentration N type doped polycrystalline silicon, high concentration P type doped polycrystalline silicon, Au, TaN, Al, Mo, Mg, Cr, Pd, Pt, and Ti.

* * * * *